United States Patent
Robinson

(10) Patent No.: US 11,283,144 B2
(45) Date of Patent: Mar. 22, 2022

(54) HARMONIC TRAP FILTER USING COUPLED RESONATORS

(71) Applicant: Lockheed Martin Corporation, Bethesda, MD (US)

(72) Inventor: Kevin L. Robinson, Liverpool, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 162 days.

(21) Appl. No.: 16/588,287

(22) Filed: Sep. 30, 2019

(65) Prior Publication Data

US 2021/0098853 A1    Apr. 1, 2021

(51) Int. Cl.
| | |
|---|---|
| H01P 1/212 | (2006.01) |
| H01P 1/38 | (2006.01) |
| H03F 3/189 | (2006.01) |
| H03F 3/60 | (2006.01) |
| H03H 7/06 | (2006.01) |
| H03H 7/38 | (2006.01) |
| H03H 7/01 | (2006.01) |

(52) U.S. Cl.
CPC ............ *H01P 1/212* (2013.01); *H03F 3/189* (2013.01); *H03F 3/60* (2013.01); *H03H 7/06* (2013.01); *H03H 7/1758* (2013.01); *H03H 7/1775* (2013.01); *H03H 7/38* (2013.01)

(58) Field of Classification Search
CPC .... H01P 1/365; H01P 1/37; H01P 1/38; H01P 1/397; H01P 1/383; H01P 1/212
USPC ................................................. 333/1.1, 24.2
See application file for complete search history.

(56) References Cited

U.S. PATENT DOCUMENTS

| | | | | |
|---|---|---|---|---|
| 5,814,901 | A * | 9/1998 | Ihara ......................... | H02J 3/01 307/105 |
| 2004/0263255 | A1* | 12/2004 | Morimoto ............... | H03F 3/265 330/286 |
| 2013/0207872 | A1* | 8/2013 | Bakalski .................. | H03H 7/40 343/860 |
| 2018/0309179 | A1* | 10/2018 | Mizutani ................ | H01P 1/213 |

OTHER PUBLICATIONS

"Novel miniaturized circulator opens way to doubling wireless capacity", DARPA, Apr. 15, 2016.
Estep et al., "Magnetless Microwave Circulators Based on Spatiotemporally Modulated Rings of Coupled Resonators", IEEE Transactions on Microwave Theory and Techniques, vol. 64, No. 2, Feb. 2016.
Alù, Andrea, "Magnetic-Free Non-Reciprocal Devices and Components", Department of Electrical and Computer Engineering, The University of Texas at Austin.

* cited by examiner

*Primary Examiner* — Rakesh B Patel
(74) *Attorney, Agent, or Firm* — Michael Best & Friedrich LLP

(57) ABSTRACT

A harmonic trap filter suppresses at least one harmonic signal produced by an amplifier and includes an input terminal and a ground terminal. The harmonic trap filter further includes a plurality of resonators electrically coupled one to another between the input terminal and the ground terminal in a spatial order defined by relative phase shift of alternating voltage bias signals respectively applied thereto. The resonators are tuned to resonate at a frequency at which a phase delay is imparted to the at least one harmonic signal by the resonators to effect cancelation of the at least one harmonic signal at the input terminal.

19 Claims, 7 Drawing Sheets

HARMONIC TRAP FILTER USING COUPLED RESONATORS

BACKGROUND

High power amplifiers often generate unwanted harmonic content due to nonlinearities inherent in the circuit components from which the amplifiers are built. In radar, for example, amplifier harmonics can cause elevated sidelobes as well as a mischaracterization of the actual range ambiguity function. Obviously, to avoid such system anomalies, the harmonic content must be filtered out. Such additional filtering is usually realized in series with the high power amplifier output, thus lowering the desired output level by filter insertion loss. This additional filtering is thus costly in terms of power loss and dollars.

SUMMARY

A harmonic trap filter suppresses a harmonic signal produced by an amplifier and includes an input terminal and a ground terminal. The filter further includes a plurality of resonators electrically coupled one to another between the input terminal and the ground terminal in a spatial order defined by relative phase shift of alternating voltage bias signals respectively applied thereto. The resonators are tuned to resonate at a frequency at which a phase delay is imparted to the harmonic signal by the resonators to effect cancelation of the harmonic signal at the input terminal.

A radio-frequency (RF) transmitter comprises an amplifier and a harmonic trap filter to suppress at least one harmonic signal produced by the amplifier. The harmonic trap filter includes an input terminal, a ground terminal and a plurality of resonators electrically coupled one to another between the input terminal and the ground terminal in a spatial order defined by relative phase shift of alternating voltage bias signals respectively applied thereto. The resonators are tuned to resonate at at least one frequency at which a phase delay is imparted to the at least one harmonic signal by the resonators to effect cancelation of the at least one harmonic signal at the input terminal.

A shunt harmonic trap filter comprises an input terminal, a first magnet-free isolator circuit and a second magnet-free isolator circuit electrically coupled in series with the first magnet-free isolator circuit to define a non-reciprocal circuit path that begins and ends at the input terminal.

DETAILED DESCRIPTION

Figure 1:
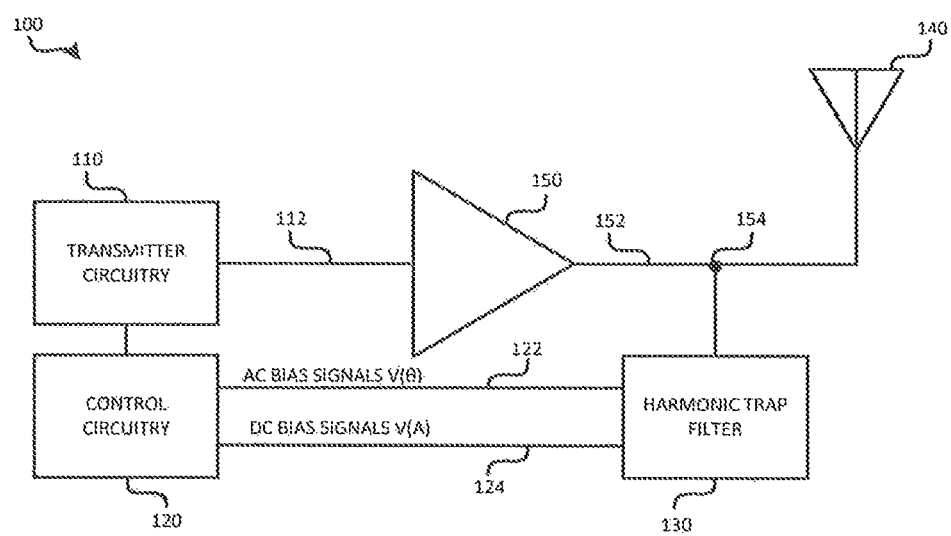
FIG. 1 is a schematic block diagram of a transmitter by which the principles of the present disclosure may be embodied.

The present concept is best described through certain embodiments thereof, which are described in detail herein with reference to the accompanying drawings, wherein like reference numerals refer to like features throughout. It is to be understood that the term invention, when used herein, is intended to connote the concept underlying the embodiments described below and not merely the embodiments themselves. It is to be understood further that the general concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

FIG. 1 is a schematic block diagram of a transmitter 100 by which the principles of the present disclosure may be embodied. Such a transmitter 100 may be found in numerous applications including radar and telecommunications. Transmitter 100 may include transmitter circuitry 110 by which a waveform 112 is generated. Waveform 112 is provided to amplifier 150, which generates transmitter waveforms 152, Transmitter waveforms 152 can include not only the desired amplified signal, but also undesired artifacts, e.g., harmonics of waveform 112. Harmonic trap filter 130 may be constructed or otherwise configured to remove harmonics at its input node 154 by way of the principles described herein. The filtered waveform, which can be an amplified version of waveform 112, may be provided to an antenna 140 or other mechanism for conveying the signal over a medium.

Transmitter 100 may include control circuitry 120 by which operations of transmitter 100 are coordinated. As illustrated in the FIG. 1, control circuitry 120 may provide signals to harmonic trap filter 130, such as AC bias signals 122 and DC bias signals 124. Each of AC bias signals 122 and DC bias signals 124 may be dynamically altered for filtering signals that have non-stationary frequency characteristics, e.g., signals undergoing linear frequency modulation (LFM) also referred to as chirp modulation.

Figure 2:
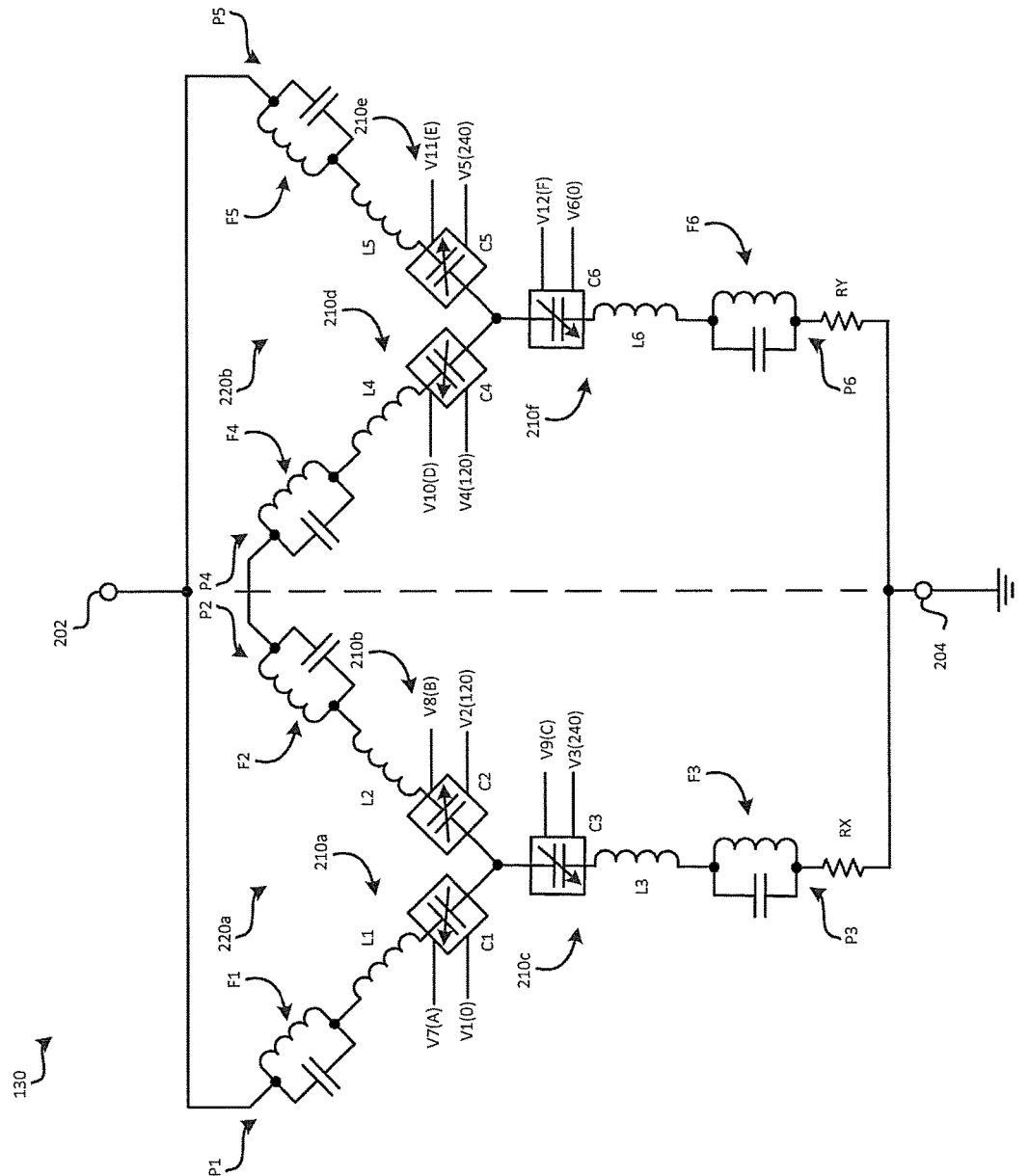
FIG. 2 is an electrical schematic diagram of an example harmonic trap filter by which the principles described herein can be embodied.

FIG. 2 is an electrical schematic diagram of an example harmonic trap filter 130 by which the principles described herein can be embodied. It is to be understood that the circuit illustrated in FIG. 2 is but one possible topology by which the harmonic trap filter functionality described herein can be realized. The harmonic trap filter function may be achieved using non-reciprocal features, where, as used herein, non-reciprocity refers to the case where the response of a system is different when the source and receiver are interchanged. Coupled resonator circuits may be used in shunt with the high power amplifier output and may be tuned so that the phase delay at any harmonic frequency that needs to be suppressed uses the harmonic signal to create cancelation. Multiple coupled resonators may be used for shorting out additional harmonic frequencies. The coupled resonator circuits may also be actively tuned during a LFM waveform so the harmonic traps can move dynamically with the fundamental and lower the unwanted harmonic content.

As illustrated in FIG. 2, harmonic trap filter 130 may comprise an input terminal 202 and a ground terminal 204 electrically coupled to a plurality of resonators 210a-210f, representatively referred to herein as resonator(s) 210. Each resonator 210 may comprise an inductor L1-L6, respectively, and a variable capacitance C1-C6, respectively.

Figure 3:
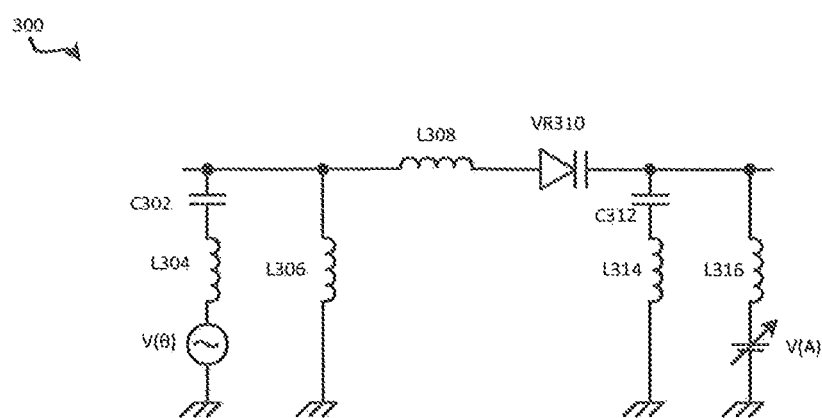
FIG. 3 is an electrical schematic diagram of an example variable capacitance circuit that may be used to embody the principles of this disclosure.

Turning momentarily to FIG. 3, them is illustrated an example variable capacitance circuit 300 that may be used to embody the principles of this disclosure. Variable capacitance circuit 300 may be realized at C1-C6 illustrated in FIG. 2. Variable capacitance may be achieved by applying a variable DC voltage to varactor VR310 by a voltage source V(A), where A is an amplitude of the DC capacitance control signal. In certain embodiments, V(A) can be varied with sufficient rapidity to dynamically modify the capacitance, and hence the resonant frequency of the corresponding resonator 210, during non-stationary frequency waveforms, e.g., LFM waveforms.

Each variable capacitance circuit 300 may further be coupled to an AC voltage source V(θ), where θ is a phase angle relative to that of other resonators 210. The purpose of this phase angle is described in more detail below. In certain embodiments, the amplitude and frequency of V(θ) is static across all resonators 210, with the frequency being much lower than that of harmonic frequencies being filtered. For example, for a 1 GHz resonator, the modulation frequency may be 70-210 MHz. In other embodiments, the amplitude of AC voltage source V(A) may be varied to alter the capacitance of varactor VR 310, in which case DC voltage source V(A) may be held constant.

It is to be understood that variable capacitance circuit 300 may be implemented in ways other than that illustrated in FIG. 3. Those having skill in microwave circuits will recognize numerous variable capacitance techniques that can be used without departing from the spirit of the principles described herein. The filtering and choke elements, C302, L304, L306, L308, C312, L314 and L316 may be chosen according the operating frequencies of the application being implemented. Moreover, it is to be understood that techniques other than variable capacitance can be used to realize the principles described herein, which will be apparent to skilled artisans upon review of this disclosure.

Returning to FIG. 2, it is to be observed that resonators 210 are coupled one to another in an order defined by the phase shift θ of the AC voltage applied thereto. For example, resonator 210a may have an AC voltage V1(0) applied thereto, resonator 210b may have an AC voltage V2(120) applied thereto and resonator 210c may have an AC voltage V3(240) applied thereto. Similarly, resonator 210d may have an AC voltage V4(120) applied thereto, resonator 210e may have an AC voltage V5(240) applied thereto and resonator 210f may have an AC voltage V6(0) applied thereto. The phase angle differences are applied in, for example, 120° increments around sets of resonators 210 to define spatiotemporally modulated loops of resonators 210. It is to be understood, however, that other phase increments, e.g., 90°, may be used to embody the principles described herein. Additionally, it is to be understood that while resonators 210 are illustrated as being wye-connected, other topologies, such as delta-connected resonators may also implement the principles of this disclosure. These spatiotemporally modulated loops of resonators 210 realize non-reciprocity with respect to ports P1-P3 and P4-P6. When so embodied, resonators 210 implement a pair of coupled circulators 220a and 220b, representatively referred to herein as circulator(s) 220. Bandpass filters F1-F6 contain the bias voltages V1-V12 within circulators 220.

Figure 4:
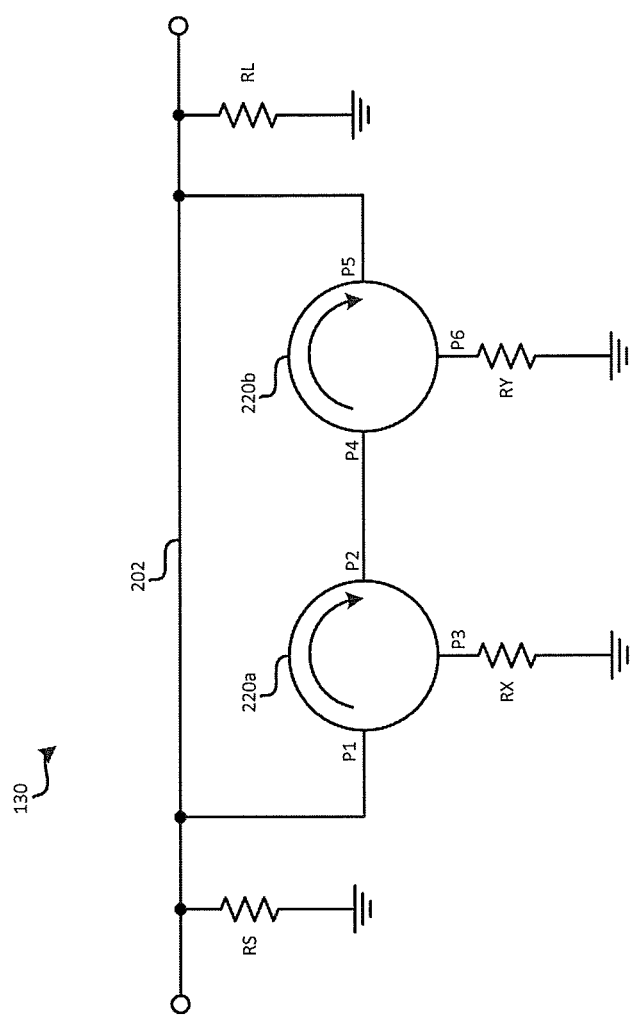
FIG. 4 is an electrical schematic diagram of a harmonic trap filter at a higher level of abstraction than that illustrated in FIG. 2.

FIG. 4 is an electrical schematic diagram of harmonic trap filter 130 at a higher level of abstraction than that illustrated in FIG. 2. It is to be understood that circulators 220a and 220b can be implemented by spatiotemporal modulation and not by magnetic bias by permanent magnets. As used herein, such circulators are referred to herein as "magnet-free" circulators. By way of the principles described herein, resonators of circulators 220a and 220b can be tuned to impart a 90° phase delay from port to port. That is, at resonance (where the losses from P1 to P2 in circulator 220a and from P4 to P5 in circulator 220 are minimum and the isolation between P1 to P3 in circulator 220a and between P4 to P6 in circulator 220b are maximum) there may be a 90° phase delay from port P1 to port P2 of circulator 220a and an additional 90° phase delay from port P4 to port P5 of circulator 220b for a total of 180° phase delay through both circulators 220a and 220b. Thus, at the chosen harmonic frequency for which harmonic trap filter 130 is tuned, there is a cancelation of the harmonic signal at the input node 202.

As illustrated in FIG. 4, port P3 of circulator 220a and port P6 of circulator 220b are terminated in respective resistive loads, RX and RY (also shown in FIG. 2). As such, circulators 220a and 220b form respective isolators that define a non-reciprocal electrical path that begins and ends at input terminal 202, i.e., from input terminal 202, through ports P1 and P2 of circulator 220a, through ports P4 and P5 of circulator 220b and terminating at input terminal 202. As stated above, a harmonic signal component that traverses this circuit path can undergo a 180° phase delay to effect cancelation of the harmonic signal component at input terminal 202. Resistors RS and RL may be used for source and load impedance matching, respectively.

Figure 5:
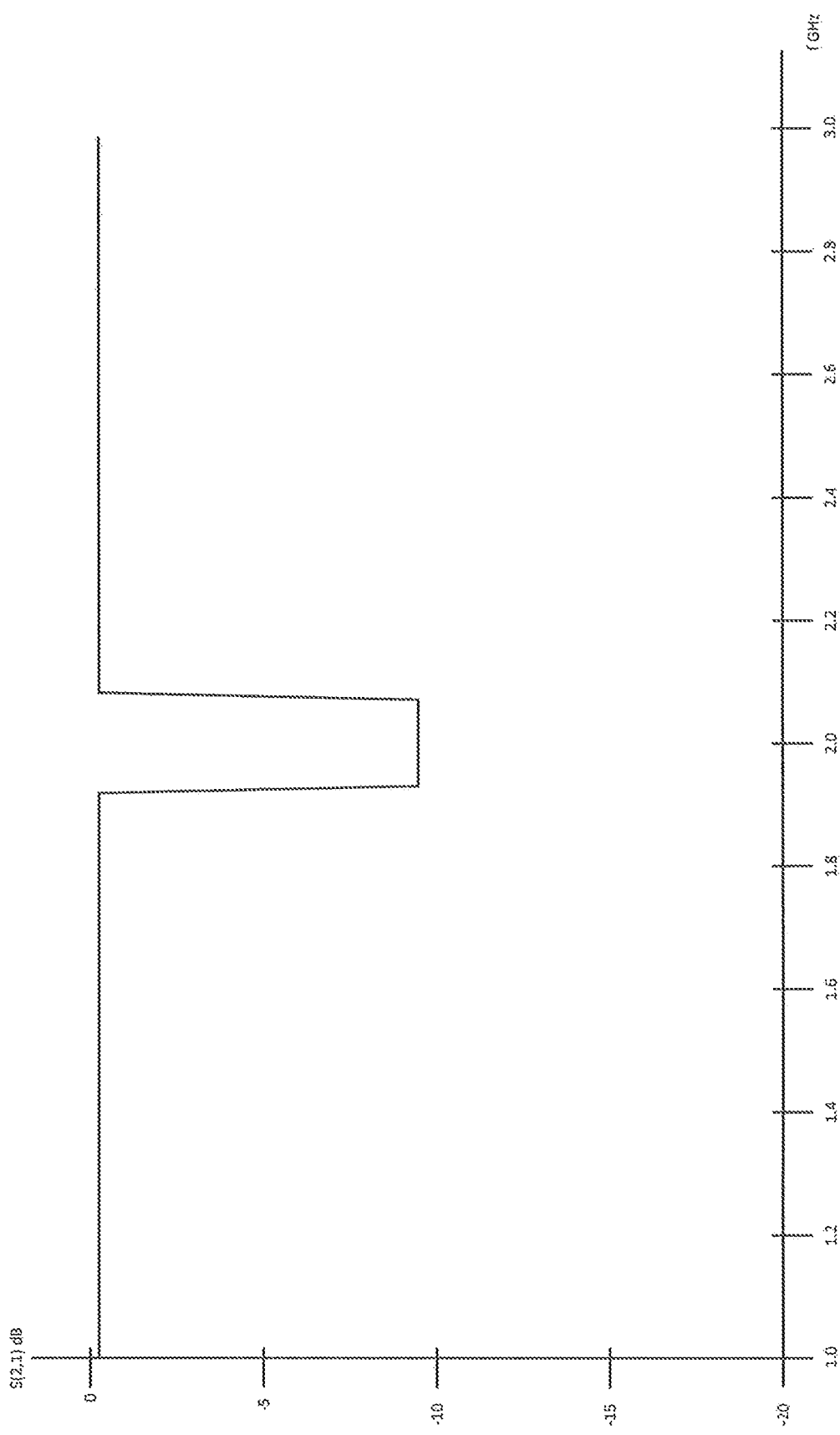
FIG. 5 is a graph of simulated transmission coefficient S(2,1) of one embodiment of the principles of this disclosure.

FIG. 5 is a graph of simulated transmission coefficient S(2,1) of the embodiment illustrated in FIG. 4. At the operating frequency of 1.0 GHz, them is little to no insertion loss, due to the shunt configuration of the harmonic trap filter 130. At the second harmonic of 2.0 GHz, however, there is a reduction of almost 10 dB through cancelation.

Figure 6:
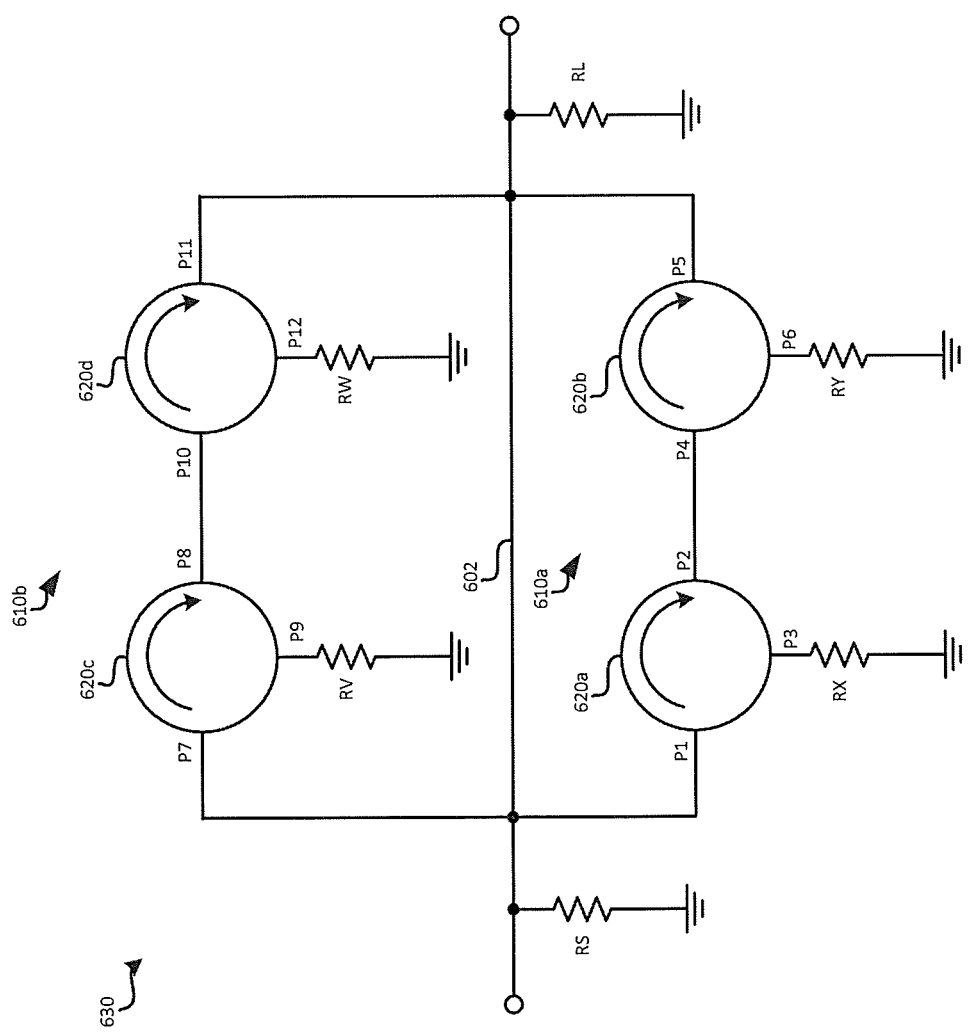
FIG. 6 is an electrical schematic diagram of another harmonic trap by which principles of the present disclosure are embodied.

FIG. 6 is an electrical schematic diagram of another harmonic trap filter 630 by which the principles described herein may be embodied. Harmonic trap filter 630 may be constructed or otherwise configured to remove multiple harmonics from a signal applied to its input node 602. To that end, harmonic trap filter 630 may include a first isolator pair 610a comprising isolators 620a and 620b, and a second isolator pair 610b comprising isolators 620c and 620d. Isolator pairs 610a and 610b are representatively referred to herein as isolator pair(s) 610 and isolators 620a-620d are representatively referred to herein as isolator(s) 620 (or isolator circuit(s) 620). Isolators 620 may be constructed from circulators, each terminated at respective third ports by an appropriate load. As illustrated in FIG. 6, isolator 620a is constructed from a circulator terminated in RX at its port P3, isolator 620b is constructed from a circulator terminated in RY at its port P6, isolator 620c is constructed from a circulator terminated in RV at its port P9 and isolator 620d is constructed from a circulator terminated in RW at its port P12. Resistors RS and RL serve as example source and load impedance matching circuits, respectively.

Each isolator pair 610 may be constructed and may operate in the manner illustrated in FIGS. 2 and 3, although, as mentioned above, other circuit topologies may be employed to realize the spatiotemporal modulated loops of resonators. Isolator pairs 610 define respective non-reciprocal electrical paths that begin and end at input terminal 602. That is, a first electrical path proceeds from input terminal 602, through ports P1 and P2 of isolator 620a, through ports P4 and P5 of isolator 620b and terminates at input terminal 602. A second electrical path proceeds from input terminal 602, through ports P7 and P8 of isolator 620c, through ports P10 and P11 of isolator 620d and terminates at input terminal 602. Each isolator pair 610 may be tuned to different harmonic signal components of the signal applied to input terminal 602 such that, at each harmonic frequency, the corresponding harmonic signal component undergoes a 180° phase delay or shift when the corresponding electrical path is traversed thereby. The 180° phase delay applied to each harmonic effects cancelation of that harmonic at input node 602.

Figure 7:
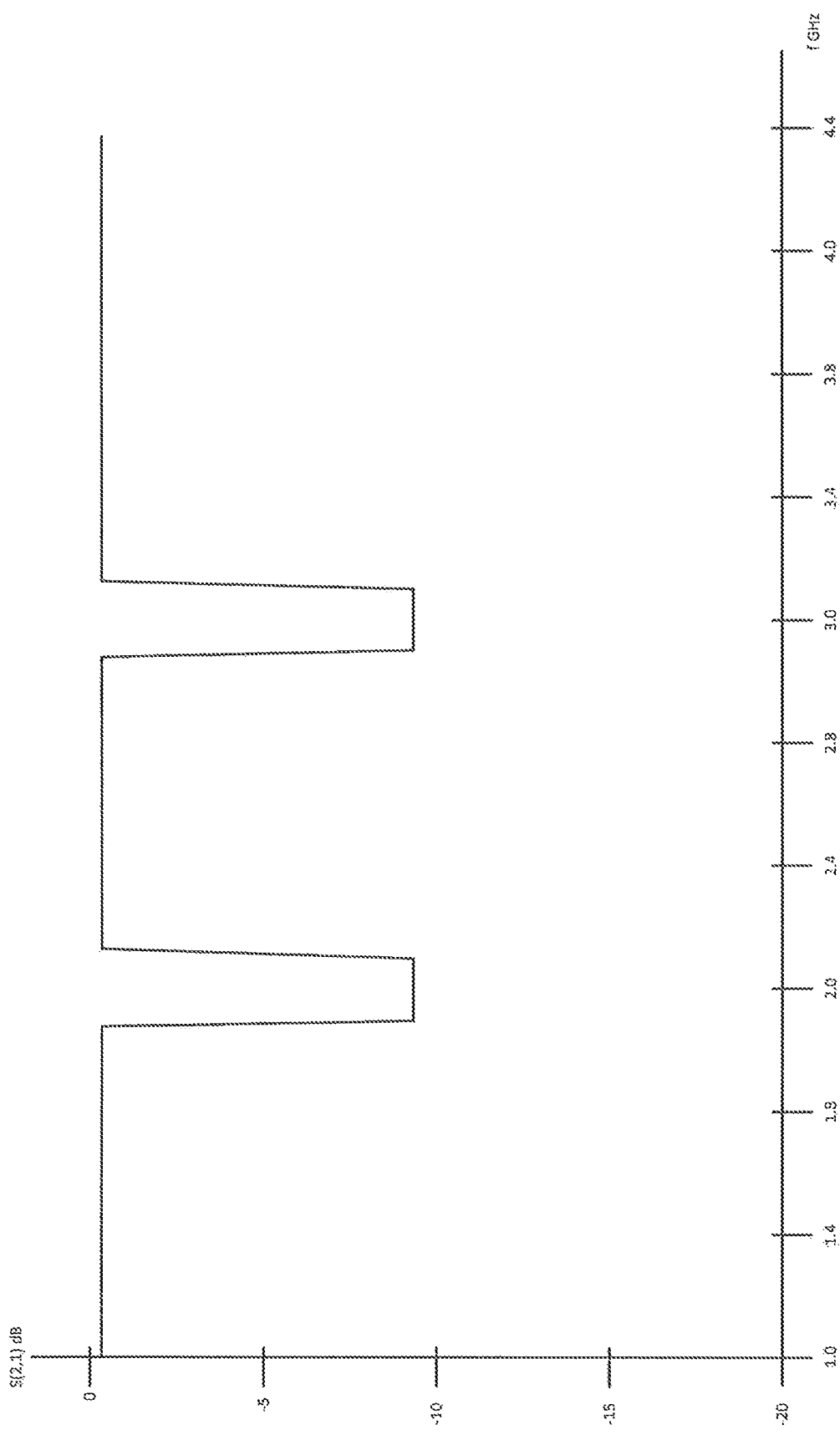
FIG. 7 is a graph of simulated transmission coefficient S(2,1) of the embodiment illustrated in FIG. 6.

FIG. 7 is a graph of simulated transmission coefficient S(2,1) of the embodiment illustrated in FIG. 6. At the operating frequency of 1.0 GHz, there is little to no insertion loss, due to the shunt configuration of the harmonic trap filter. At the second harmonic of 2.0 GHz and at the third harmonic of 3.0 GHz, however, there is a reduction of almost 10 dB through cancelation. Referring back to FIG. 6, isolator pair 610a is tuned to cancel the second harmonic of 2.0 GHz and isolator pair 610b is tuned to cancel the third harmonic of 3.0 GHz.

It is to be understood that the concept of canceling more than one harmonic signal component described with reference to FIG. 6 may be extended to any number of harmonics by incorporating additional isolator pairs as needed.

The terminology used herein is for the purpose of describing particular embodiments only and is not intended to be limiting of the principles described herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description within this disclosure has been presented for purposes of illustration and description, but is not intended to be exhaustive or limited to the forms disclosed. Many modifications and variations will be apparent to those of ordinary skill in the art without departing from the scope and spirit of the principles described herein.

The descriptions above are intended to illustrate possible implementations of the present concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the principles should therefore be determined not with reference to the description above, but with reference to the appended claims, along with their full range of equivalents.

The invention claimed is:

1. A harmonic trap filter to suppress at least one harmonic signal produced by an amplifier, the harmonic trap filter comprising:
   an input terminal and a ground terminal; and
   a plurality of resonators electrically coupled one to another between the input terminal and the ground terminal in a spatial order defined by relative phase shift of alternating voltage bias signals respectively applied thereto, the resonators being tuned to resonate at at least one frequency at which a phase delay is imparted to the at least one harmonic signal by the resonators to effect cancelation of the at least one harmonic signal at the input terminal.

2. The harmonic trap filter of claim 1, wherein the resonators are electrically coupled into isolator circuits connected in series to define at least one non-reciprocal electrical path that begins and ends at the input terminal.

3. The harmonic trap filter of claim 2, wherein the series-connected isolator circuits are series-connected circulators.

4. The harmonic trap filter of claim 3, wherein a first circulator of the series-connected circulators is electrically coupled in series with a second circulator of the series-connected circulators, where an input port of the first circulator and an output port of the second circulator are electrically coupled to the input terminal.

5. The harmonic trap filter of claim 2, wherein the relative phase shift applied to the resonators of each isolator circuit is a predetermined phase angle apart.

6. The harmonic trap filter of claim 5, wherein the predetermined phase angle is 120°.

7. The harmonic trap filter of claim 2, wherein the resonators electrically coupled into isolator circuits connected in series define respective non-reciprocal electrical paths that begin and end at the input terminal, the isolator circuits in each non-reciprocal electrical path being tuned to resonate at a frequency that is different from a frequency at which the isolator circuits in other non-reciprocal electrical paths resonate.

8. The harmonic trap filter of claim 1, further comprising:
   control circuitry to generate control signals, wherein the resonators each comprise a variable capacitive element by which resonance of the corresponding resonator is tuned, the capacitance of each variable capacitive element being established by a corresponding one of the control signals applied thereto by the control circuitry.

9. The harmonic trap filter of claim 8, wherein the control circuitry is configured to generate the control signals to vary over time such that the frequency at which the phase delay is imparted to the at least one harmonic signal varies in accordance with a frequency modulated signal applied to the input terminal.

10. A radio-frequency (RF) transmitter comprising:
    an amplifier; and
    a harmonic trap filter to suppress at least one harmonic signal produced by the amplifier, the harmonic trap filter comprising:
      an input terminal and a ground terminal; and
      a plurality of resonators electrically coupled one to another between the input terminal and the ground terminal in a spatial order defined by relative phase shift of alternating voltage bias signals respectively applied thereto, the resonators being tuned to resonate at at least one frequency at which a phase delay is imparted to the at least one harmonic signal by the resonators to effect cancelation of the at least one harmonic signal at the input terminal.

11. The RF transmitter of claim 10, wherein the resonators are electrically coupled into isolator circuits connected in series to define at least one non-reciprocal electrical path that begins and ends at the input terminal.

12. The RF transmitter of claim 11, wherein the series-connected isolator circuits are series-connected circulators.

13. The RF transmitter of claim 12, wherein a first circulator of the series-connected circulators is electrically coupled in series with a second circulator of the series-connected circulators, where an input port of the first circulator and an output port of the second circulator are electrically coupled to the input terminal.

14. The RF transmitter of claim 11, wherein the relative phase shift applied to the resonators of each isolator circuit is a predetermined phase angle apart.

15. The RF transmitter of claim 14, wherein the predetermined phase angle is 120°.

16. The RF transmitter of claim 11, wherein the resonators electrically coupled into isolator circuits connected in series define respective non-reciprocal electrical paths that begin and end at the input terminal, the isolator circuits in each non-reciprocal electrical path being tuned to resonate at a frequency that is different from a frequency at which the isolator circuits in other non-reciprocal electrical paths resonate.

17. The RF transmitter of claim 10, further comprising:
control circuitry to generate control signals, wherein the resonators each comprise a variable capacitive element by which resonance of the corresponding resonator is tuned, the capacitance of each variable capacitive element being established by a corresponding one of the control signals applied thereto by the control circuitry.

18. The RF transmitter of claim 17, wherein the control circuitry is configured to generate the control signals to vary over time such that the frequency at which the phase delay is imparted to the at least one harmonic signal varies in accordance with a frequency modulated signal applied to the input terminal.

19. A shunt harmonic trap filter comprising:
an input terminal; and
a first magnet-free isolator circuit and a second magnet-free isolator circuit electrically coupled in series with the first magnet-free isolator circuit to define a non-reciprocal circuit path that begins and ends at the input terminal, wherein each of the first magnet-free isolator circuit and the second magnet-free isolator circuit comprise a plurality of resonators, each being tuned to resonate at a frequency at which a phase delay is imparted to a harmonic signal by the first and second magnet-free isolator circuits to effect cancelation of the harmonic signal at the input terminal.

* * * * *